United States Patent
Wang et al.

(10) Patent No.: US 6,657,223 B1
(45) Date of Patent: Dec. 2, 2003

(54) STRAINED SILICON MOSFET HAVING SILICON SOURCE/DRAIN REGIONS AND METHOD FOR ITS FABRICATION

(75) Inventors: Haihong Wang, Fremont, CA (US); Qi Xiang, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/282,538

(22) Filed: Oct. 29, 2002

(51) Int. Cl.⁷ .................. H01L 29/06; H01L 31/0328
(52) U.S. Cl. .................. 257/19; 257/20; 257/192; 257/344
(58) Field of Search .................. 257/19, 20, 24, 257/192, 289, 336, 344, 382, 384

(56) References Cited

U.S. PATENT DOCUMENTS

| | | | |
|---|---|---|---|
| 6,091,076 A | * | 7/2000 | Deleonibus .................. 257/24 |
| 6,503,833 B1 | * | 1/2003 | Ajmeral et al. ............. 438/682 |
| 6,509,586 B2 | * | 1/2003 | Awano ........................ 257/192 |
| 6,555,880 B2 | * | 4/2003 | Cabral, Jr. et al. .......... 257/384 |
| 2002/0109135 A1 | * | 8/2002 | Murota et al. ................. 257/20 |
| 2003/0057439 A1 | * | 3/2003 | Fitzgerald ................... 257/192 |
| 2003/0102490 A1 | * | 6/2003 | Kubo et al. ................. 257/192 |

\* cited by examiner

Primary Examiner—T. N. Quach
(74) Attorney, Agent, or Firm—Foley & Lardner

(57) ABSTRACT

A strained silicon MOSFET utilizes a strained silicon layer formed on a silicon germanium layer. Strained silicon and silicon germanium are removed at opposing sides of the gate and are replaced by silicon regions. Deep source and drain regions are implanted in the silicon regions, and the depth of the deep source and drain regions does not extend beyond the depth of the silicon regions. By forming the deep source and drain regions in the silicon regions, detrimental effects of the higher dielectric constant and lower band gap of silicon germanium are reduced.

11 Claims, 6 Drawing Sheets

STRAINED SILICON MOSFET HAVING SILICON SOURCE/DRAIN REGIONS AND METHOD FOR ITS FABRICATION

BACKGROUND OF THE INVENTION

1. Field of the Invention

The present invention relates generally to fabrication of metal oxide semiconductor field effect transistors (MOSFETs), and, more particularly, to MOSFETs that achieve improved carrier mobility through the incorporation of strained silicon.

2. Related technology

MOSFETs are a common component of integrated circuits (ICs). FIG. 1 shows a conventional MOSFET device. The MOSFET is fabricated on a semiconductor substrate 10 within an active area bounded by shallow trench isolations 12 that electrically isolate the active area of the MOSFET from other IC components fabricated on the substrate 10.

The MOSFET is comprised of a gate electrode 14 that is separated from a channel region 16 in the substrate 10 by a thin first gate insulator 18 such as silicon oxide or oxide-nitride-oxide (ONO). To minimize the resistance of the gate 14, the gate 14 is typically formed of a doped semiconductor material such as polysilicon.

The source and drain of the MOSFET are provided as deep source and drain regions 20 formed on opposing sides of the gate 14. Source and drain suicides 22 are formed on the source and drain regions 20 and are comprised of a compound comprising the substrate semiconductor material and a metal such as cobalt (Co) or nickel (Ni) to reduce contact resistance to the source and drain regions 20. The source and drain regions 20 are formed deeply enough to extend beyond the depth to which the source and drain silicides 22 are formed. The source and drain regions 20 are implanted subsequent to the formation of a spacer 24 around the gate 14 which serves as an implantation mask to define the lateral position of the source and drain regions 20 relative to the channel region 16 beneath the gate.

The gate 14 likewise has a suicide 26 formed on its upper surface. The gate structure comprising a polysilicon material and an overlying silicide is sometimes referred to as a polycide gate.

The source and drain of the MOSFET further comprise shallow source and drain extensions 28. As dimensions of the MOSFET are reduced, short channel effects resulting from the small distance between the source and drain cause degradation of MOSFET performance. The use of shallow source and drain extensions 28 rather than deep source and drain regions near the ends of the channel 16 helps to reduce short channel effects. The shallow source and drain extensions are implanted prior to the formation of the spacer 24 and after the formation of a thin spacer 30, and the gate 14 and thin spacer 30 act as an implantation mask to define the lateral position of the shallow source and drain extensions 28 relative to the channel region 16. Diffusion during subsequent annealing causes the source and drain extensions 28 to extend slightly beneath the gate 14.

One option for increasing the performance of MOSFETs is to enhance the carrier mobility of silicon so as to reduce resistance and power consumption and to increase drive current, frequency response and operating speed. A method of enhancing carrier mobility that has become a focus of recent attention is the use of silicon material to which a tensile strain is applied. "Strained" silicon may be formed by growing a layer of silicon on a silicon germanium substrate. The silicon germanium lattice is generally more widely spaced than a pure silicon lattice as a result of the presence of the larger germanium atoms in the lattice. Because the atoms of the silicon lattice align with the more widely spread silicon germanium lattice, a tensile strain is created in the silicon layer. The silicon atoms are essentially pulled apart from one another. The amount of tensile strain applied to the silicon lattice increases with the proportion of germanium in the silicon germanium lattice.

Relaxed silicon has six equal valence bands. The application of tensile strain to the silicon lattice causes four of the valence bands to increase in energy and two of the valence bands to decrease in energy. As a result of quantum effects, electrons effectively weigh 30 percent less when passing through the lower energy bands. Thus the lower energy bands offer less resistance to electron flow. In addition, electrons encounter less vibrational energy from the nucleus of the silicon atom, which causes them to scatter at a rate of 500 to 1000 times less than in relaxed silicon. As a result, carrier mobility is dramatically increased in strained silicon as compared to relaxed silicon, offering a potential increase in mobility of 80% or more for electrons and 20% or more for holes. The increase in mobility has been found to persist for current fields of up to 1.5 megavolts/centimeter. These factors are believed to enable a device speed increase of 35% without further reduction of device size, or a 25% reduction in power consumption without a reduction in performance.

An example of a MOSFET using a strained silicon layer is shown in FIG. 2. The MOSFET is fabricated on a substrate comprising a silicon germanium layer 32 on which is formed an epitaxial layer of strained silicon 34. The MOSFET uses conventional MOSFET structures including deep source and drain regions 20, shallow source and drain extensions 28, a gate oxide layer 18, a gate 14 surrounded by spacers 30, 24, silicide source and drain contacts 22, a silicide gate contact 26, and shallow trench isolations 12. The channel region 16 of the MOSFET includes the strained silicon material, which provides enhanced carrier mobility between the source and drain.

One detrimental property of strained silicon MOSFETs of the type shown in FIG. 2 is that the band gap of silicon germanium is lower than that of silicon. In other words, the amount of energy required to move an electron into the conduction band is lower on average in a silicon germanium lattice than in a silicon lattice. As a result, the junction leakage in devices having their source and drain regions formed in silicon germanium is greater than in comparable devices having their source and drain regions formed in silicon.

Another detrimental property of strained silicon MOSFETs of the type shown in FIG. 2 is that the dielectric constant of silicon germanium is higher than that of silicon. As a result, MOSFETs incorporating silicon germanium exhibit higher parasitic capacitance, which increases device power consumption and decreases driving current and frequency response.

Therefore the advantages achieved by incorporating strained silicon into MOSFET designs are partly offset by the disadvantages resulting from the use of a silicon germanium substrate.

SUMMARY OF THE INVENTION

It is an object of the present invention to provide a strained silicon MOSFET device that exploits the benefits of strained silicon while reducing the detrimental effects of the use of silicon germanium to support the strained silicon layer.

In accordance with embodiments of the invention, a MOSFET incorporates a strained silicon layer that is supported by a silicon germanium layer. Strained silicon and silicon germanium at the locations of deep source and drain regions are removed and replaced with silicon regions. Deep source and drain regions are then implanted in the silicon regions. The formation of source and drain regions in the silicon regions reduces junction leakage and parasitic capacitance and therefore improves device performance compared to the conventional strained silicon MOSFET.

In accordance with one embodiment of the invention, a MOSFET incorporating strained silicon is fabricated. Initially a substrate is provided. The substrate includes a layer of silicon germanium having a layer of strained silicon formed thereon. The substrate further includes a gate insulator formed on the strained silicon layer and a gate formed on the gate insulator, and shallow source and drain extensions formed at opposing sides of the gate. A spacer is then formed around the gate and gate insulator. The strained silicon layer and silicon germanium layer are then etched to form trenches adjacent to the spacer at the opposing sides of the gate. Silicon regions are then formed in the trenches, and deep source and drain regions are formed in the silicon regions at the opposing sides of the gate. The depth of the deep source and drain regions does not extend beyond the depth of the silicon regions.

In accordance with another embodiment of the invention, a MOSFET incorporating strained silicon is provided. The MOSFET includes a substrate comprising a layer of silicon germanium, and a gate that overlies a strained silicon layer formed on the silicon germanium layer and that is separated from the strained silicon layer by a gate insulator. Silicon regions are formed at opposing ends of the gate adjacent to ends of the strained silicon layer. Shallow source and drain extensions are formed at opposing ends of the gate in the strained silicon layer, and deep source and drain regions are formed at the opposing ends of the gate in the silicon regions. The depth of the deep source and drain regions does not extend beyond the depth of the silicon regions.

DESCRIPTION OF THE DRAWINGS

Embodiments of the invention are described in conjunction with the following drawings, in which.

DETAILED DESCRIPTION OF PREFERRED EMBODIMENTS

Figure 1:
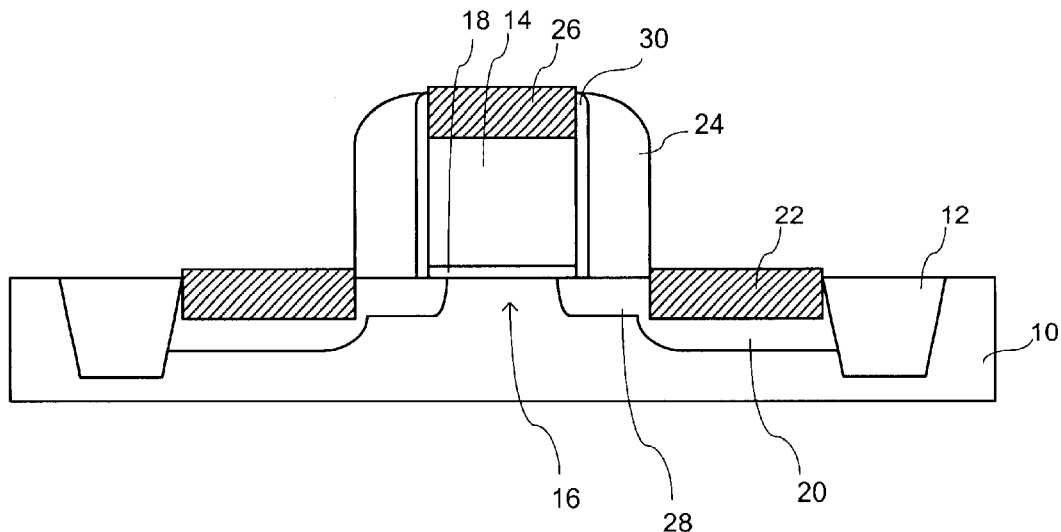
FIG. 1 shows a conventional MOSFET formed in accordance with conventional processing.
Figure 2:
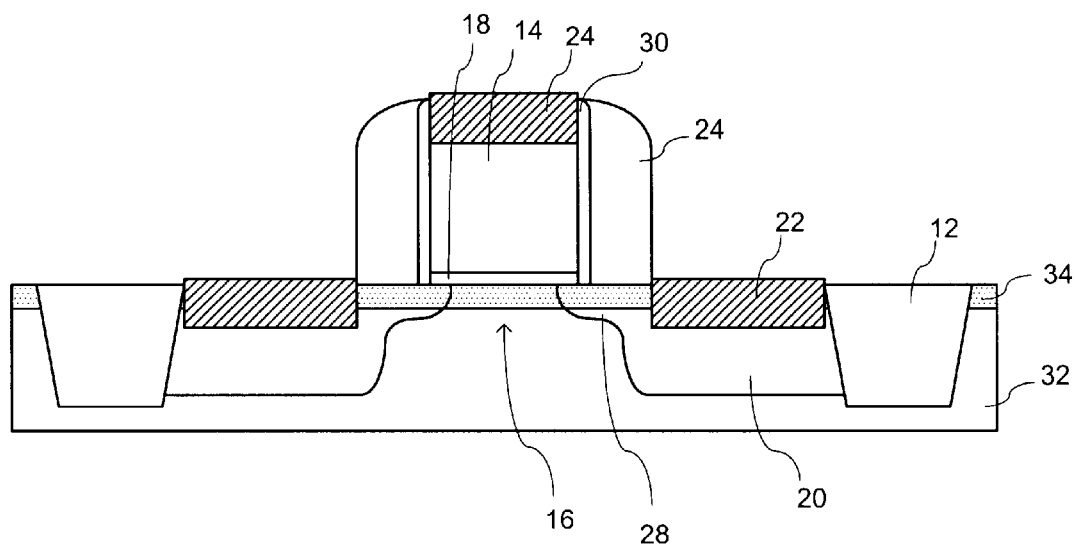
FIG. 2 shows a strained silicon MOSFET device formed in accordance with the conventional processing used to form the MOSFET of FIG. 1.
Figure 3A:
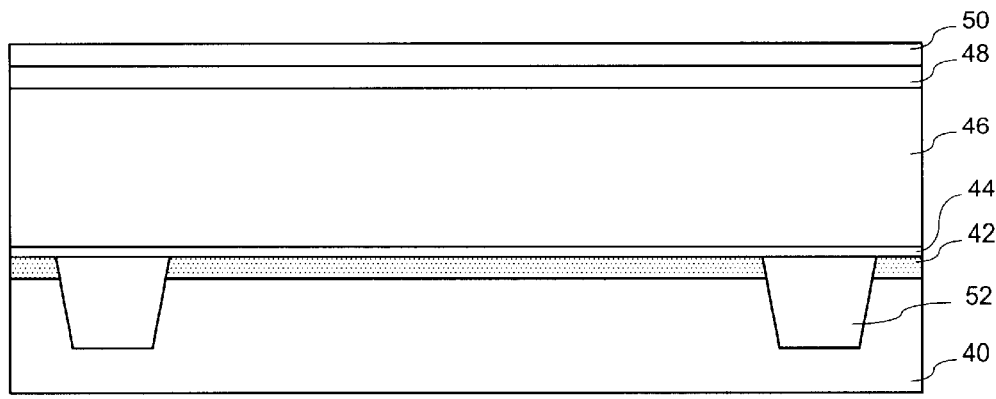
FIGS. 3a, 3b, 3c, 3d, 3e, 3f, 3g, 3h, 3i and 3j show structures formed during production of a MOSFET device in accordance with a first preferred embodiment of the invention.

FIGS. 3a–3i show structures formed during fabrication of a strained silicon MOSFET in accordance with a preferred embodiment of the invention. FIG. 3a shows a structure comprising a layer of silicon germanium 40 having an epitaxial layer of strained silicon 42 formed on its surface. The silicon germanium layer 40 preferably has a composition $Si_{1-x}Ge_x$, where x is approximately 0.2, and is more generally in the range of 0.1 to 0.3. The silicon germanium layer 40 is typically grown on a silicon wafer. Silicon germanium may be grown, for example, by chemical vapor deposition using $Si_2H_6$ (disilane) and $GeH_4$ (germane) as source gases, with a substrate temperature of 600 to 900 degrees C, a $Si_2H_6$ partial pressure of 30 mPa, and a $GeH_4$ partial pressure of 60 mPa. $SiH_4$ (silane) may be used in alternative processes. Growth of the silicon germanium material may be initiated using these ratios, or alternatively the partial pressure of $GeH_4$ may be gradually increased beginning from a lower pressure or zero pressure to form a gradient composition. The thickness of the silicon germanium layer may be determined in accordance with the particular application. The upper portion of the silicon germanium substrate 40 on which the strained silicon layer 42 is grown should have a uniform composition.

The strained silicon layer 42 is preferably grown by chemical vapor deposition (CVD) using $Si_2H_6$ as a source gas with a partial pressure of 30 mPa and a substrate temperature of approximately 600 to 900 degrees C. The strained silicon layer is preferably grown to a thickness of 200 Angstroms.

As further shown in FIG. 3a, a gate insulating layer 44 is formed on the strained silicon layer 42. The gate insulating layer 44 is typically silicon oxide but may be another material such as oxide-nitride-oxide (ONO). An oxide may be grown by thermal oxidation of the strained silicon layer, but is preferably deposited by chemical vapor deposition.

Formed over the gate insulating layer 44 is a gate conductive layer 46. The gate conductive layer 46 typically comprises polysilicon but may alternatively comprise another material such as polysilicon implanted with germanium.

Overlying the gate conductive layer 46 is a bi-layer hardmask structure comprising a bottom hardmask layer 48, also referred to as a bottom antireflective coating (BARC), and an upper hardmask layer 50. The bottom hardmask layer 48 is typically silicon oxide (e.g. $SiO_2$) and the upper hardmask layer 50 is typically silicon nitride (e.g. $Si_3N_4$).

The silicon germanium substrate also has formed therein shallow trench isolations 52. The shallow trench isolations may be formed by forming trenches having tapered sidewalls in the silicon germanium 40 and strained silicon 42 layers, performing a brief thermal oxidation, and then depositing a layer of silicon oxide to a thickness that is sufficient to fill the trenches, such as by low pressure CVD (LPCVD) TEOS or atmospheric pressure ozone TEOS. The silicon oxide layer is then densified and planarized such as by chemical mechanical polishing or an etch back process, leaving shallow trench isolations 52 that are approximately level with the surface of the strained silicon layer 42.

Figure 3B:
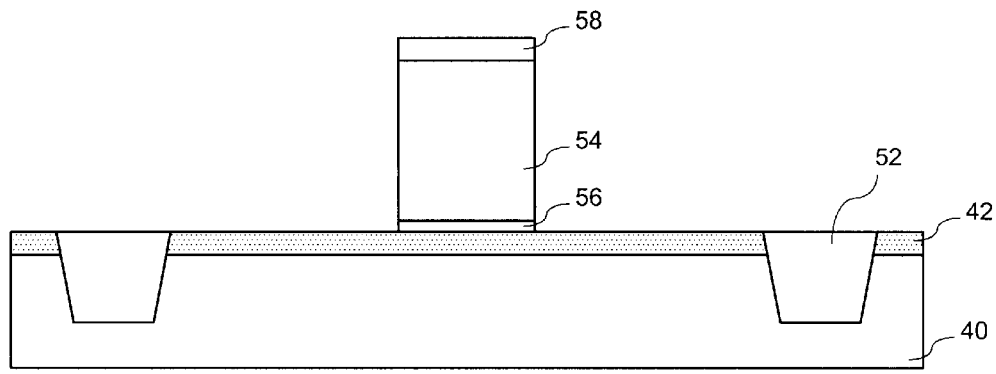

FIG. 3b shows the structure of FIG. 3a after patterning of the gate conductive layer and gate insulating layer to form a gate 54 and a self-aligned gate insulator 56. Patterning is performed using a series of anisotropic etches that patterns the upper hardmask layer using a photoresist mask as an etch mask, then patterns the lower hardmask layer using the patterned upper hardmask layer as an etch mask, then patterns the polysilicon using the patterned lower hardmask layer as an etch mask, then patterns the gate insulating layer using the gate 54 as a hardmask. As shown in FIG. 3b, the thickness of the lower hardmask layer is chosen such that after patterning of the gate insulating layer, a portion of the lower hardmask layer remains on the gate as a protective cap 58.

Figure 3C:
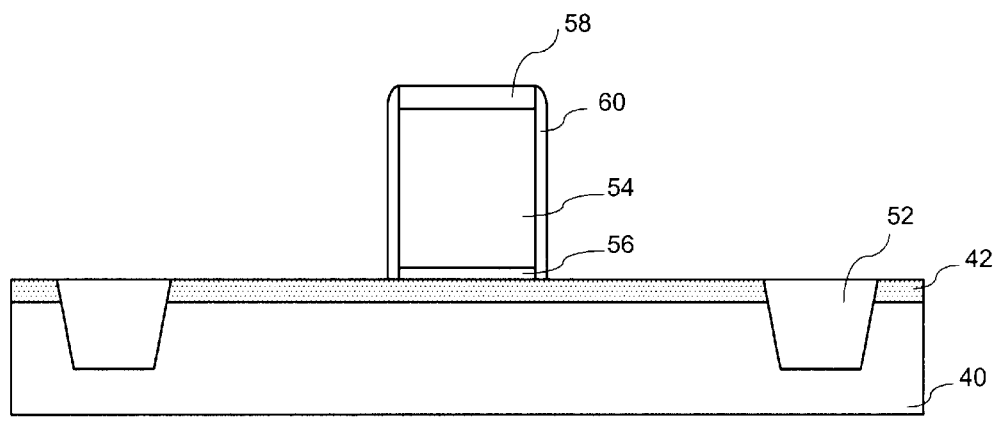

FIG. 3c shows the structure of FIG. 3b after formation of a thin first spacer 60 around the gate 54, the gate insulator 56 and the protective cap 58. The thin first spacer 60 is preferably formed by deposition of a conformal layer of a protective material, followed by anisotropic etching to remove the protective material from the non-vertical surfaces to leave the thin first gate spacer 60. The thin first spacer 60 is preferably formed of silicon oxide or silicon nitride.

Figure 3D:
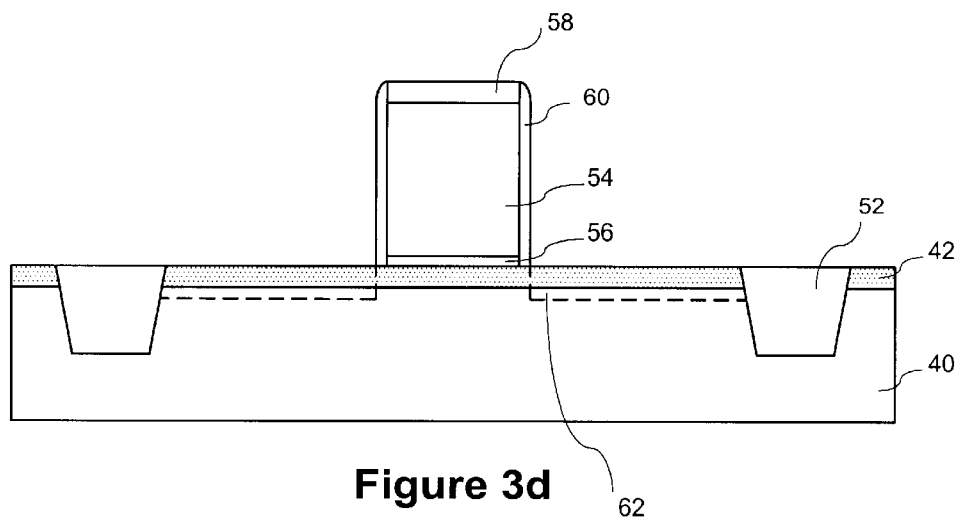

FIG. 3d shows the structure of FIG. 3c after implantation of dopant to form shallow source and drain extensions 62 in the strained silicon layer 42 and silicon germanium layer 40 at opposing sides of the gate 54. Halo regions (not shown) may be implanted prior to implantation of the shallow source and drain extensions 62. Halo regions are regions that are implanted with a dopant that is opposite in conductivity type to the conductivity type of an adjacent region. The dopant of the halo regions retards diffusion of the dopant of the adjacent region. Halo regions are preferably implanted using a low energy at a small angle to the surface of the substrate so that the halo regions extend beneath the gate 54 to beyond the anticipated locations of the ends of the source and drain extensions 62 after annealing. The halo regions are formed at opposing sides of the channel region, and extend toward the channel region beyond the ends of the source and drain extensions to be formed.

Figure 3E:
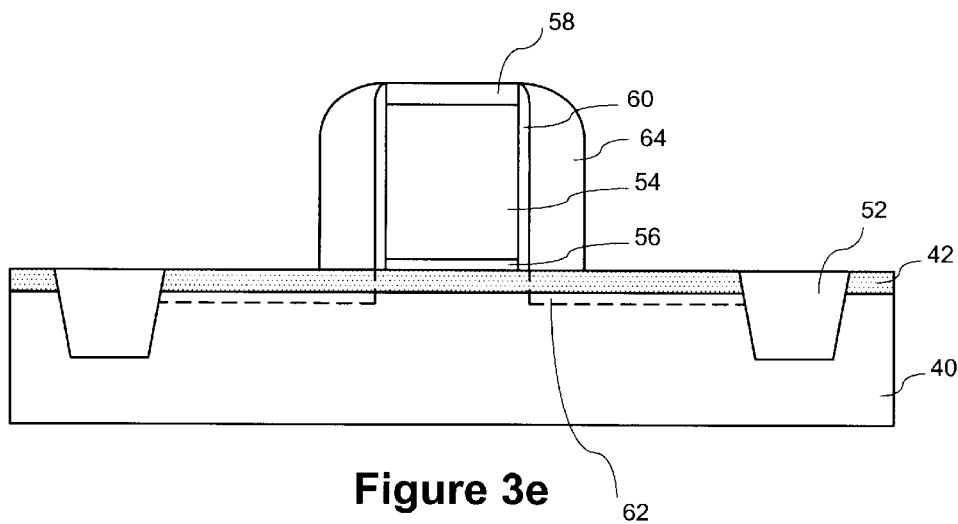

FIG. 3e shows the structure of FIG. 3d after formation of a second spacer 64 around the first spacer 60 and gate 54. The second spacer 64 is preferably formed of a material such as silicon oxide or silicon nitride.

Figure 3F:
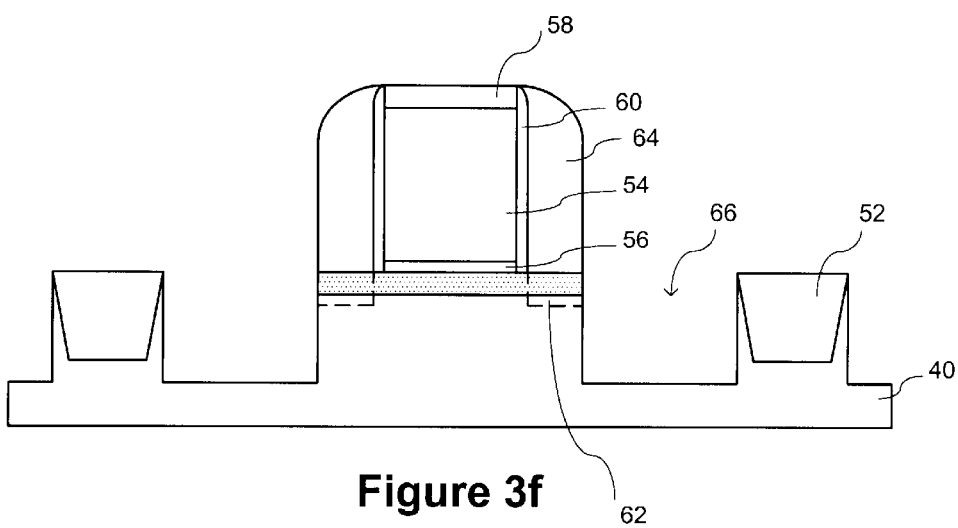

FIG. 3f shows the structure of FIG. 3e after anisotropic etching of the strained silicon layer 42 and the silicon germanium layer 40 to form trenches 66 at opposing sides of the second spacer 64 and gate 54. Typical etch chemistries are CF4 and HBr. The etch is essentially self-masking because the spacers 64 and protective cap 58 protect the gate structure, and the shallow trench isolations 52 define the outer boundaries of the etch. Therefore the edges of the trenches are aligned to the edges of the spacer 64 and the edges of the shallow trench isolations 52. The trenches 66 are etched to a depth that is great enough to contain deep source and drain regions that are formed in later processing.

Figure 3G:
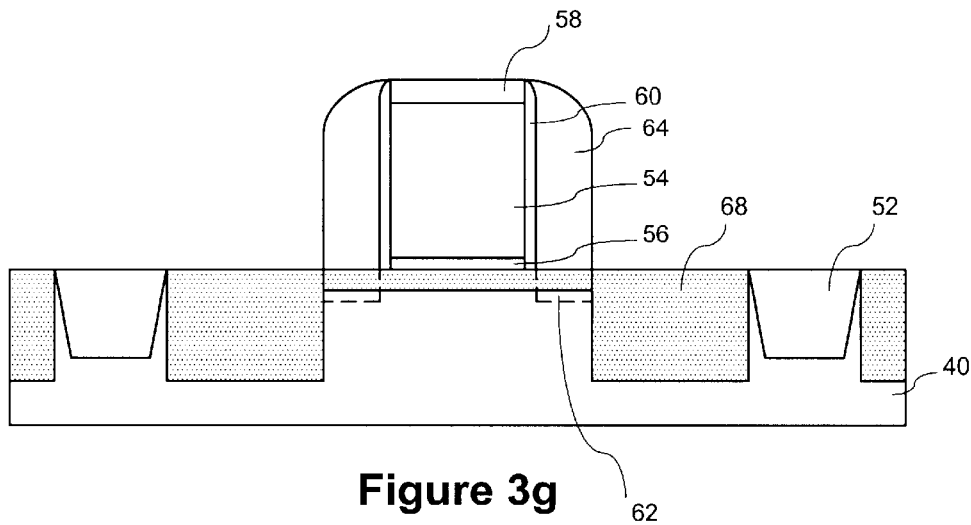

FIG. 3g shows the structure of FIG. 3f after selective epitaxial growth of silicon in the trenches to form silicon regions 68 in the trenches at opposing sides of the gate 54. Preferably the selective growth of silicon is performed in a manner that produces no silicon growth on regions other than the exposed crystalline surfaces of the silicon germanium layer 40 and the strained silicon. Such growth may be performed, for example, by chemical vapor deposition using $SiBr_4$ as a source gas. Alternatively, $SiHCl_3$ may be used, or a mixture of $SiH_2Cl_2$, $SiH_4$ and HCl or $Cl_2$ may be used. As a general matter, the selectivity of the deposition process is improved by decreased pressure, increased temperature, and a decreased mole fraction of silicon in the source gas stream. The selective growth process produces crystalline silicon growth on the exposed crystalline surfaces of the silicon germanium 40 and strained silicon. Any silicon material deposited on other surfaces such as the second gate spacer 64, the shallow trench isolations 52 and the gate protective cap 58 will be polycrystalline in form. Where selectivity cannot be precisely controlled, it may be desirable to follow selective growth of silicon with a brief exposure to an etchant that is highly selective to polysilicon so as to remove any unwanted polysilicon material from structures such as the gate spacer 64, the shallow trench isolations 52 and the gate protective cap 58. Appropriate masking, such as with photoresist, may be used to inhibit growth and facilitate removal in areas where silicon growth is not desired.

Figure 3H:
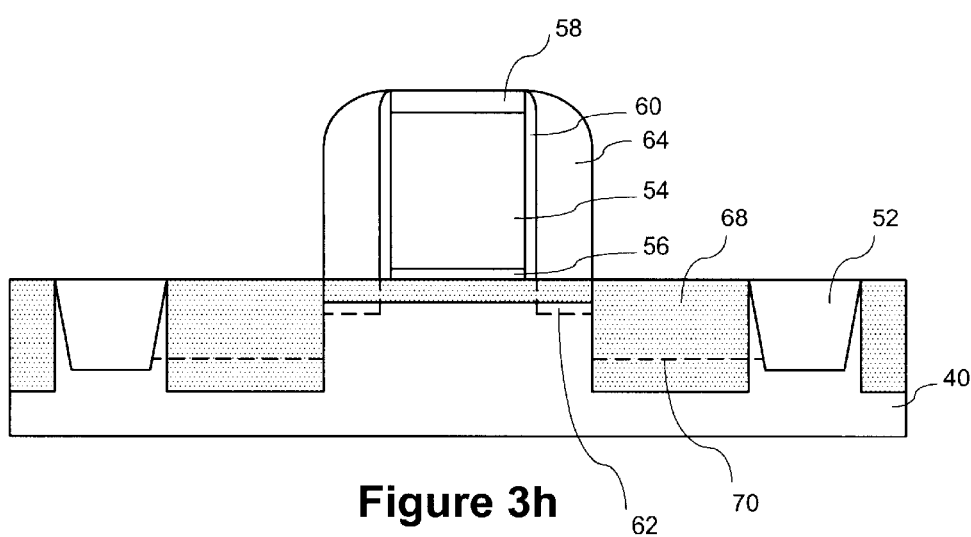

FIG. 3h shows the structure of FIG. 3g after formation of deep source and drain regions 70 in the silicon regions 68 at opposing sides of the gate by implantation of dopant. The second spacer 64 serves as an implant mask during implantation of the deep source and drain regions 70 to define the position of the source and drain regions 70 relative to the gate 54. The implantation is performed such that the depth of the deep source and drain regions 70 does not extend beyond the depth of the silicon regions 66 upon implantation, or after diffusion of dopant resulting from annealing as described below.

Figure 3I:
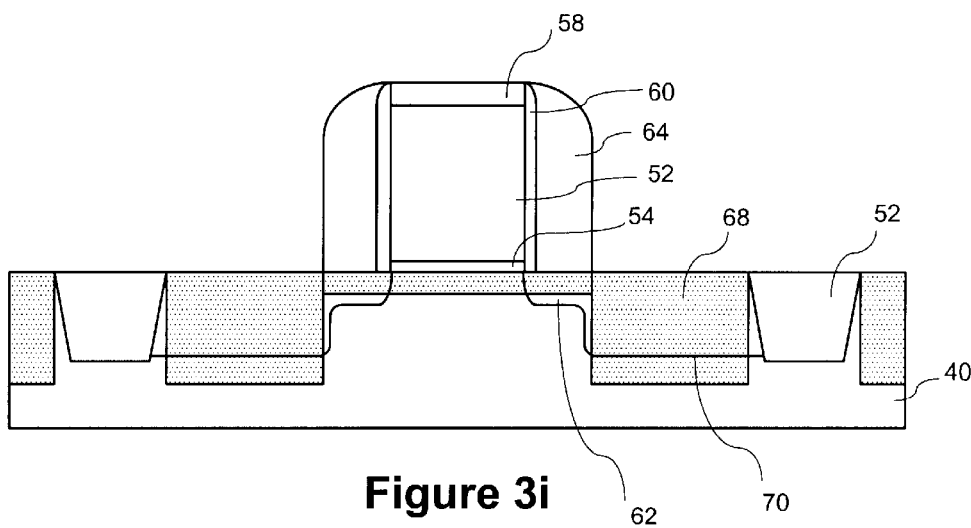

FIG. 3i shows the structure of FIG. 3h after performing rapid thermal annealing (RTA) to anneal the silicon regions 68 and the silicon germanium layer 40 and to activate the dopants implanted in the shallow source and drain extensions 62 and the deep source and drain regions 70. During annealing the implanted dopant undergoes diffusion, however the depth of the silicon regions 68 is chosen such that after annealing the depth of the deep source and drain regions 70 does not extend beyond the depth of the silicon regions 68. As a result the parasitic capacitance and junction leakage of the device are improved compared to a conventional strained silicon MOSFET having source and drain regions formed in a silicon germanium layer.

Figure 3J:
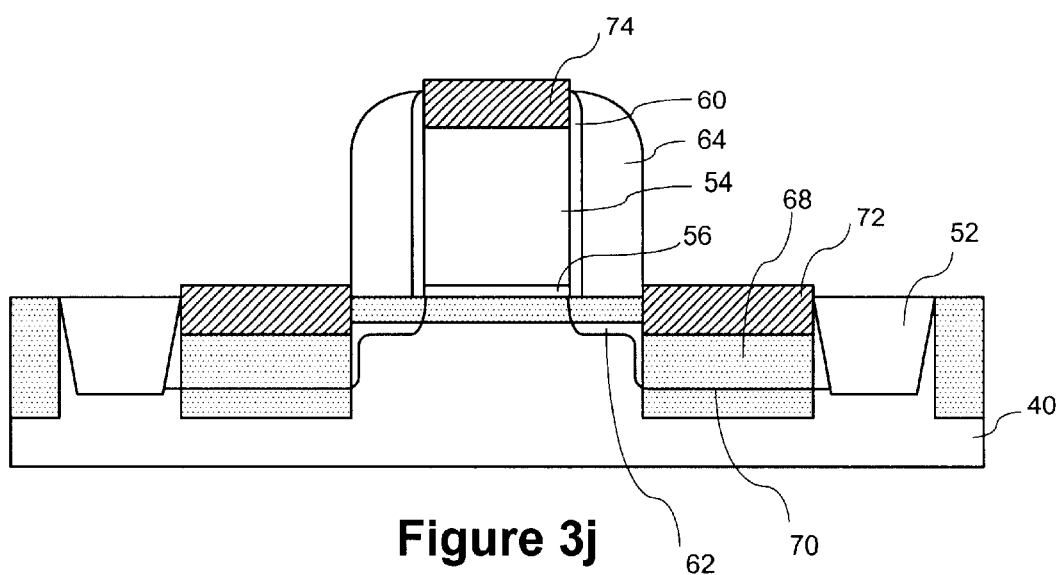

FIG. 3j shows the structure of FIG. 3i after removal of the protective gate cap 58 to expose the upper surface of the gate 54, followed by formation of silicide contacts 72 on the source and drain regions 70 and formation of a silicide contact 74 on the gate 54. The silicide contacts 72, 74 are formed of a compound comprising a semiconductor material and a metal. Typically a metal such as cobalt (Co) is used, however other metals such as nickel (Ni) may also be employed. The silicide contacts are formed by depositing a thin conformal layer of the metal over the substrate, and then annealing to promote suicide formation at the points of contact between the metal and underlying semiconductor materials, followed by stripping of residual metal.

While the processing shown in FIGS. 3a–3j represents a presently preferred embodiment, a variety of alternatives may be implemented. For example, in one alternative embodiment, a third spacer may be formed around the second spacer after growth of the silicon regions in the trenches and before implantation of the deep source and drain regions in the silicon regions. In contrast to the structure shown in FIG. 3g, the use of a third spacer causes the lateral edges of the implanted deep source and drain regions to be located within the silicon regions rather than at the lateral junctions of the silicon regions with the silicon germanium layer. Through appropriate selection of the thickness of the third spacer, the structures of the deep source and drain regions may be controlled so that even after diffusion the deep source and drain regions do not project laterally into the silicon germanium layer.

Accordingly, a variety of embodiments in accordance with the invention may be implemented. In general terms, such embodiments encompass a MOSFET that includes a strained silicon channel region formed on a silicon germanium layer, and source and drain regions formed in silicon regions that are provided at opposing sides of the gate. The depth of the source and drain regions does not extend beyond the depth of the silicon regions, thus reducing the detrimental junction leakage and parasitic capacitance of conventional silicon germanium implementations.

Figure 4:
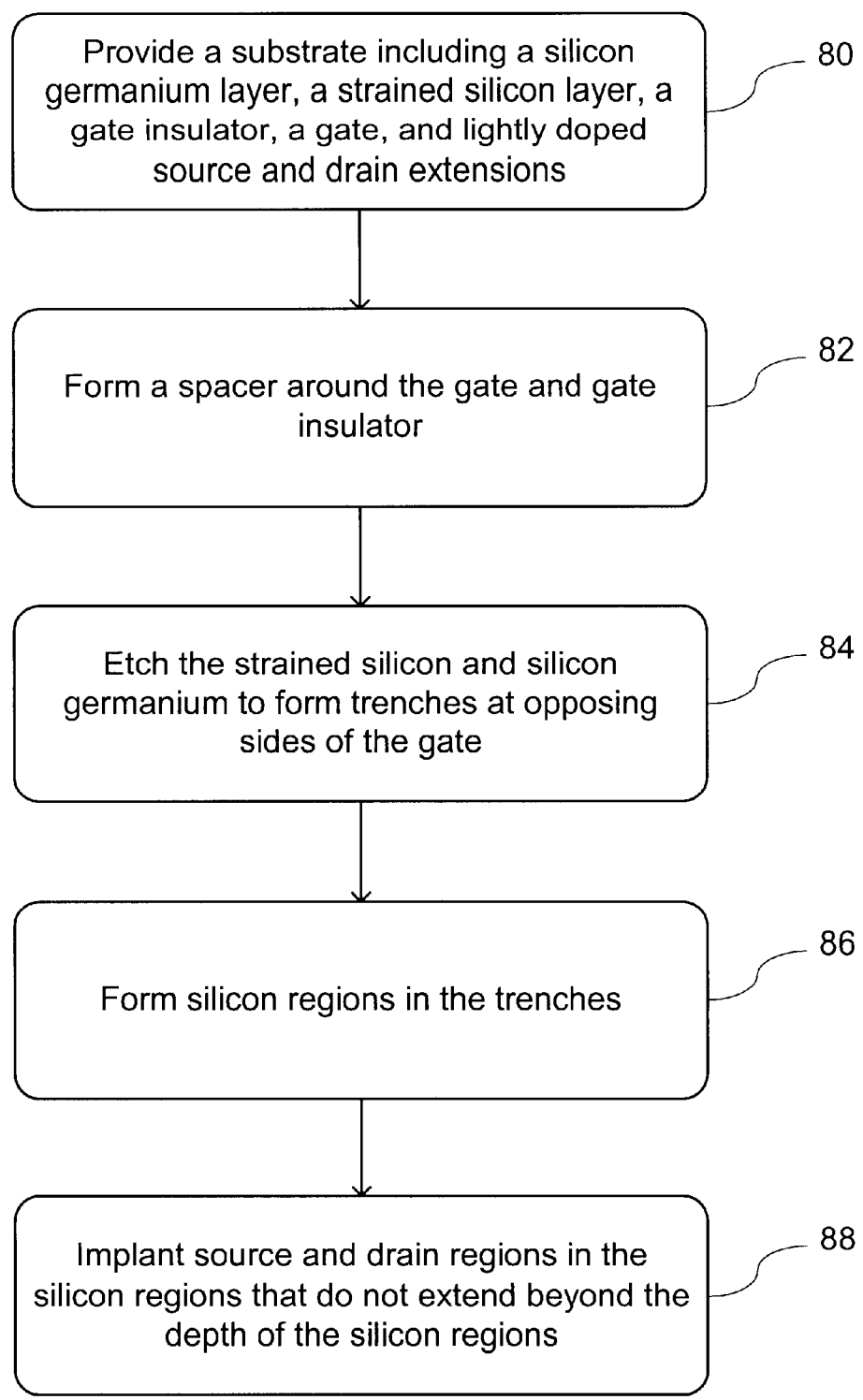
FIG. 4 shows a process flow encompassing the first preferred embodiment and alternative embodiments.

FIG. 4 shows a process flow encompassing the preferred embodiment of FIGS. 3a–3j, the aforementioned alternatives and other alternatives. Initially a substrate is provided (80). The substrate includes a layer of silicon germanium having a layer of strained silicon formed thereon. The substrate further includes a gate insulator formed on the strained silicon layer and a gate formed on the gate insulator, and shallow source and drain extensions. A spacer is then formed around the gate and gate insulator (82). The strained silicon layer and silicon germanium layer are then etched to form trenches at opposing sides of the gate (84). The edges of the trenches are aligned approximately with the edges of the spacer. Silicon regions are then formed in the trenches (86), and deep source and drain regions are implanted in the silicon regions (88). The depth of the deep source and drain regions does not extend beyond the depth of the silicon regions.

It will be apparent to those having ordinary skill in the art that the tasks described in the above processes are not necessarily exclusive of other tasks, but rather that further tasks may be incorporated into the above processes in accordance with the particular structures to be formed. For example, intermediate processing tasks such as formation and removal of passivation layers or protective layers between processing tasks, formation and removal of photoresist masks and other masking layers, doping and counter-doping, cleaning, planarization, and other tasks, may be performed along with the tasks specifically described above. Further, the process need not be performed on an entire substrate such as an entire wafer, but rather may be performed selectively on sections of the substrate. Thus, while the embodiments illustrated in the figures and described above are presently preferred, it should be understood that these embodiments are offered by way of example only. The invention is not limited to a particular embodiment, but extends to various modifications, combinations, and permutations that fall within the scope of the claimed inventions and their equivalents.

What is claimed is:

1. A metal oxide semiconductor field effect transistor (MOSFET) device, comprising:

a substrate comprising a layer of silicon germanium;

a gate overlying a strained silicon layer that is formed on the silicon germanium layer, the gate being separated from the strained silicon layer by a gate insulator;

silicon regions formed in the silicon germanium layer at opposing sides of the gate adjacent to ends of the strained silicon layer;

shallow source and drain extensions formed at said opposing sides of the gate in the strained silicon layer; and deep source and drain regions formed at said opposing sides of the gate in the silicon regions, wherein a depth of the deep source and drain regions does not extend beyond a depth of the silicon regions.

2. The device claimed in claim 1, further comprising a thin first spacer formed around the gate and gate insulator.

3. The device claimed in claim 2, further comprising a second spacer formed around the first spacer.

4. The device claimed in claim 3, further comprising a third spacer formed around the second spacer prior to formation of the deep source and drain regions.

5. The device claimed in claim 4, wherein the deep source and drain regions do not project laterally into the silicon germanium layer from the silicon regions.

6. The device claimed in claim 1, further comprising silicide source and drain contacts and a silicide gate contact.

7. The device claimed in claim 6, wherein the silicide source and drain contacts and the silicide gate contact comprise nickel.

8. The device claimed in claim 1, wherein the silicon germanium layer has a composition $Si_{1-x}Ge_x$, where x is in the range of 0.1 to 0.3.

9. The device claimed in claim 1, wherein the gate comprises polysilicon.

10. The device claimed in claim 1, wherein the gate insulator comprises silicon oxide.

11. The device claimed in claim 1, further comprising halo regions formed at opposing sides of a channel region and extending toward the channel region beyond ends of the source and drain extensions, the halo regions comprising a dopant having a conductivity type opposite to the conductivity type of a dopant of the source and drain extensions.

* * * * *